United States Patent [19]
Oashi et al.

[11] Patent Number: 5,654,573
[45] Date of Patent: Aug. 5, 1997

[54] SEMICONDUCTOR DEVICE HAVING SOI STRUCTURE AND MANUFACTURING METHOD THEREFOR

[75] Inventors: Toshiyuki Oashi; Takahisa Eimori, both of Hyogo, Japan

[73] Assignee: Mitsubishi Denki Kabushiki Kaisha, Tokyo, Japan

[21] Appl. No.: 740,511

[22] Filed: Oct. 30, 1996

Related U.S. Application Data

[63] Continuation of Ser. No. 487,049, Jun. 7, 1995, abandoned.

[30] Foreign Application Priority Data

Nov. 28, 1994 [JP] Japan ................. 6-293205

[51] Int. Cl.$^6$ ................. H01L 27/01; H01L 27/12; H01L 29/76
[52] U.S. Cl. ................. 257/349; 257/347; 257/350; 257/351; 257/398; 257/400
[58] Field of Search ................. 257/347, 349, 257/350, 351, 398, 400

[56] References Cited

U.S. PATENT DOCUMENTS 5,324,960 6/1994 Pfiester et al. ............... 257/349
5,440,161 8/1995 Iwamatsu et al. ............ 257/349

FOREIGN PATENT DOCUMENTS

| 4-176165 | 6/1992 | Japan . |
| 4-177876 | 6/1992 | Japan . |
| 4-307972 | 10/1992 | Japan . |
| 5-183157 | 7/1993 | Japan . |
| 5-299437 | 11/1993 | Japan . |

OTHER PUBLICATIONS

A.H. Hamdi, et al, "Novel SOI CMOS Design Using Ultra Thin Near Intrinsic Substrate," 1982 IEDM, pp. 107–110.

*Primary Examiner*—Mahshid D. Saadat
*Assistant Examiner*—Valencia Martin Wallace
*Attorney, Agent, or Firm*—Lowe, Price, LeBlanc & Becker

[57] ABSTRACT

A semiconductor device having an SOI structure which involves no parasitic MOS transistor and substrate floating effect and has a planar element isolation region and, a manufacturing method therefor. In the semiconductor device, a field shield gate composed of an oxide film and a field shield gate electrode is formed to be buried under an SOI layer. As a result, it is possible to prevent generation of a parasitic transistor and substrate floating effects inherent in field shield gate while obtaining a planar element isolation structure.

11 Claims, 10 Drawing Sheets

PARASTIC MOS TRANSISTOR

FIG. 20  PRIOR ART

SEMICONDUCTOR DEVICE HAVING SOI STRUCTURE AND MANUFACTURING METHOD THEREFOR

This application is a continuation of Application Ser. No. 08/487,049 filed Jun. 7, 1995, now abandoned.

BACKGROUND OF THE INVENTION

1. Field of the Invention

The present invention relates generally to semiconductor devices and manufacturing methods therefor and, more particularly, semiconductor devices having SOI (Silicon on Insulator) structures and manufacturing methods therefor.

2. Description of the Background Art

With an increase in storage capacity of a memory, a memory transistor used for the storage conventionally becomes miniaturized. This makes it more and more difficult to improve performance of memory transistors. Transistors formed on an SOI layer have much higher performance than that of transistors formed on an ordinary silicon substrate. More specifically, a transistor having an SOI structure has a reduced leakage current, excellent subthreshold characteristics and high current drive capability. Because of these advantages, application of a transistor having the SOI structure is expected to a memory device such as a DRAM or a logic circuit whose element size is smaller than quarter-micron. In the case of a DRAM (Dynamic Random Access Memory), for example, a memory cell formed on an SOI layer can completely eliminate soft error, and because of an extremely small junction capacitance it allows a refresh cycle time to be increased. Thus, a memory cell transistor of a DRAM having the SOI structure achieves much higher performance than that can be achieved by a memory cell transistor formed on an ordinary silicon substrate.

Figure 18:
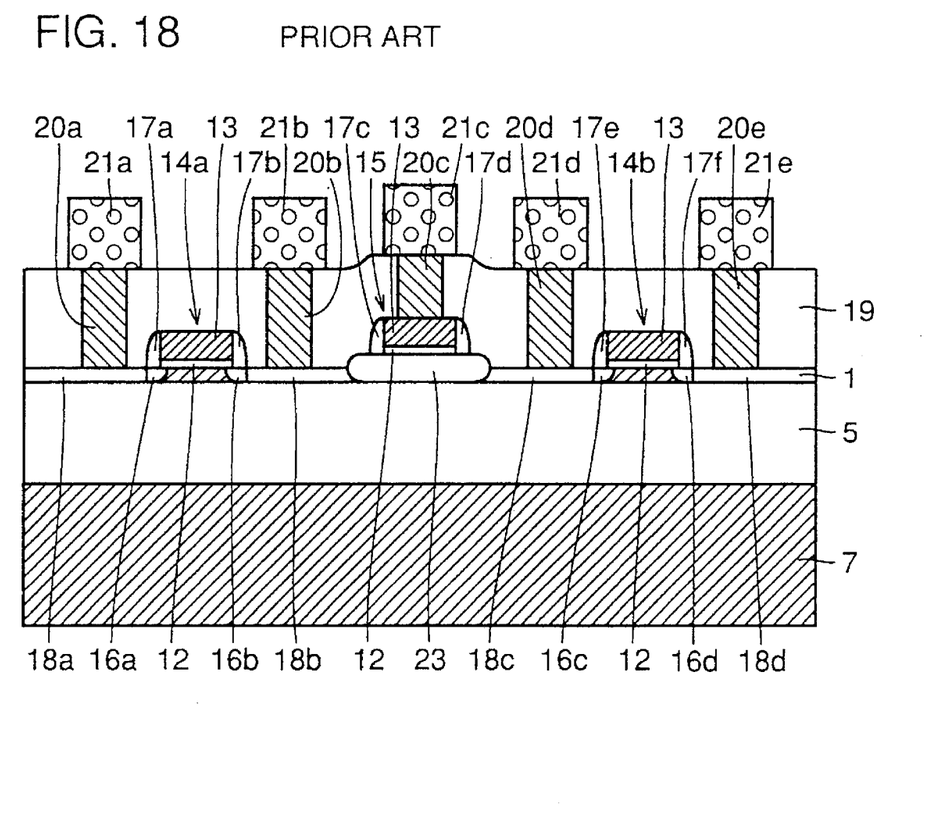
FIG. 18 is a sectional view showing a semiconductor device having an SOI structure employing conventional LOCOS isolation.
Figure 19:
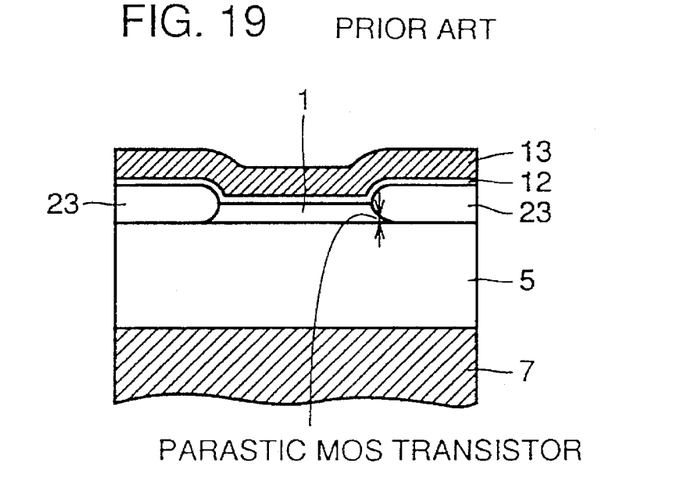
FIG. 19 is a view showing a cross-section taken along a direction perpendicular to the section shown in FIG. 18.

Methods for isolating elements formed on an SOI layer mainly include three types, LOCOS (Local Oxidation of Silicon) isolation, mesa-type isolation and field shield isolation. FIG. 18 is a sectional view showing a semiconductor device having an SOI structure based on conventional LOCOS isolation. FIG. 19 is a view showing a section taken along a direction perpendicular to that shown in FIG. 18. With reference to FIGS. 18 and 19, in the SOI structure employing conventional LOCOS isolation, a silicon oxide film 5 is formed on a silicon substrate 7. An SOI layer 1 is formed on silicon oxide film 5. Active transistors 14a and 14b are formed at a predetermined interval from each other on SOI layer 1. Active transistor 14a is formed of n-type impurity regions 16a, 18a and 16b, 18b consisting source/drain regions, and a gate electrode 13 formed on SOI layer 1 between n-type impurity regions 16a and 16b with a gate oxide film 12 interposed therebetween. Sidewall oxide films 17a and 17b are formed on the opposite side surfaces of gate electrode 13 to be in contact therewith.

Active transistor 14b is formed of n-type impurity regions 16c, 18c and 16d, 18d constituting source/drain regions, and gate electrode 13 formed on SOI layer 1 between n-type impurity regions 16c and 16d with gate oxide film 12 interposed therebetween. Sidewall oxide films 17e and 17f are formed on the opposite side surfaces of gate electrode 13 to be in contact therewith.

In an isolation region located between active transistors 14a and 14b, a LOCOS oxide film 23 is formed for isolating elements. On LOCOS oxide film 23, a gate electrode 13 is formed with a gate oxide film 12 interposed therebetween. Sidewall oxide films 17c and 17d are formed on the opposite sides of gate electrode 13 to be in contact therewith. An interlayer insulating film 19 made of a silicon oxide film is formed to cover the whole surface and contact holes are formed at predetermined regions of the film. In these contact holes, plug electrodes 20a, 20b, 20c, 20d and 20e are buried so as to be electrically in contact with n-type impurity regions 18a, 18b, gate electrode 13 on LOCOS oxide film 23, n-type impurity regions 18c and 18d, respectively. The SOI structure employing LOCOS isolation is realized by the foregoing arrangement.

Figure 20:
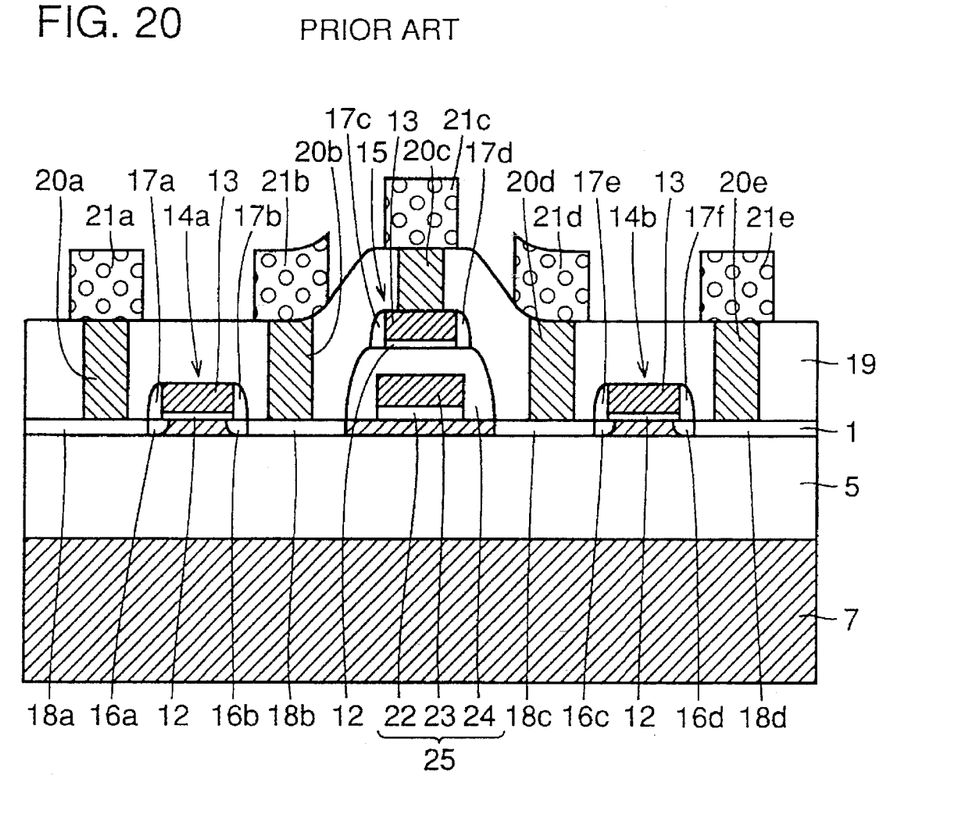
FIG. 20 is a sectional view showing a semiconductor device having an SOI structure employing conventional field shield isolation.

FIG. 20 is a sectional view showing an SOI structure employing conventional field shield isolation. This SOI structure is identical to that employing LOCOS isolation shown in FIG. 18 with the only difference in isolation regions. In the structure employing field shield isolation, a field shield gate 25 is formed on the isolation region of SOI layer 1. Field shield gate 25 is composed of a field shield gate electrode 23 formed on the isolation region of SOI layer 1 with an oxide film 22 interposed therebetween, and an oxide film 24 formed to cover field shield gate electrode 23. On this field shield gate 25, a gate electrode 13 is formed with a gate oxide film 12 interposed therebetween. The SOI structure employing conventional field shield isolation is realized by the foregoing arrangement.

First, the SOI structure employing conventional LOCOS isolation shown in FIGS. 18 and 19 has a disadvantage that a parasitic MOS transistor is generated at a part of SOI layer 1 whose thickness is reduced due to LOCOS oxide film 23 as illustrated in FIG. 19. The parasitic MOS transistor has a threshold voltage lower than that of an original MOS transistor, so that it can be turned on before the turn-on of the original MOS transistor, causing adverse effects on electrical characteristics of the original MOS transistor. On the other hand, the SOI structure employing conventional LOCOS isolation has a drawback that substrate floating effects (parasitic bipolar effects) cause reduction of breakdown voltages of the source/drain regions of active transistors 14a and 14b. More specifically, holes generated by impact ionization are stored in a channel region of a transistor to increase a substrate potential, while the holes newly induce electrons from the side of the source. As a result, a breakdown voltage between a pair of source and drain regions is reduced. Such substrate floating effect is also a problem in mesa-type isolation.

The above-descried SOI structure employing field shield isolation has a disadvantage that a height of an isolation region is greater than that of other regions to create a large step. This makes it difficult to pattern gates and aluminum interconnections on an isolation region of large height, which results in complication of a manufacturing process.

SUMMARY OF THE INVENTION

One object of the present invention is to provide a planar structure for a semiconductor device in which generation of a parasitic transistor and substrate floating effects can be prevented.

Another object of the present invention is to manufacture a semiconductor device involving no parasitic transistor and substrate floating effect and having a planar structure with ease in a semiconductor device manufacturing method.

A semiconductor device according to one aspect of the present invention includes a semiconductor layer, a transistor and a field shield gate electrode. The semiconductor layer is formed on a first insulating layer. The transistor is formed in an active region of the semiconductor layer. The field shield gate electrode is formed only under an element isolation region of the semiconductor layer with a second insulating layer interposed therebetween. Preferably, a conductor layer is formed under the first insulating layer, and the conductor layer and the field shield gate electrode are electrically connected to each other through a plug electrode provided in the first insulating layer. More preferably, a third insulating layer is formed in the element isolation region on the semiconductor layer and a gate electrode is formed on the third insulating layer with a gate insulating film interposed therebetween.

Since in this semiconductor device, a field shield gate electrode is formed only under an element isolation region of a semiconductor layer with a second insulating layer interposed therebetween, the device has advantages of having its elements planarized as well as preventing generation of a parasitic transistor and substrate floating effects inherent in field shield isolation. Forming a conductor layer under a first insulating layer and electrically connecting a field shield gate electrode to the conductor layer through a plug electrode provided in the first insulating layer enables application of a predetermined potential to the field shield gate electrode through the conductor layer and the plug electrode. In addition, forming a third insulating layer in an element isolation region on the semiconductor layer and forming a gate electrode on the third insulating layer with a gate insulating film interposed therebetween allows the third insulating layer to reduce effects of electric fields produced by the gate electrode.

In a semiconductor device manufacturing method according to another aspect of the present invention, a field shield gate electrode is formed in an element isolation region on a main surface of a first semiconductor substrate with a first insulating film interposed therebetween. A second insulating film is formed to cover the field shield gate electrode and then a contact hole is formed above the field shield gate electrode. A conductor layer is formed to fill in the contact hole. A second semiconductor substrate is formed to be in contact with an upper surface of the second insulating film and an upper surface of the conductor layer. A rear surface of the first semiconductor substrate is cut by a predetermined thickness to form a semiconductor layer.

In this manner, this semiconductor device manufacturing method forms a field shield gate electrode buried under a semiconductor layer with ease. As a result, a planar SOI structure employing field shield isolation can be obtained with ease.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
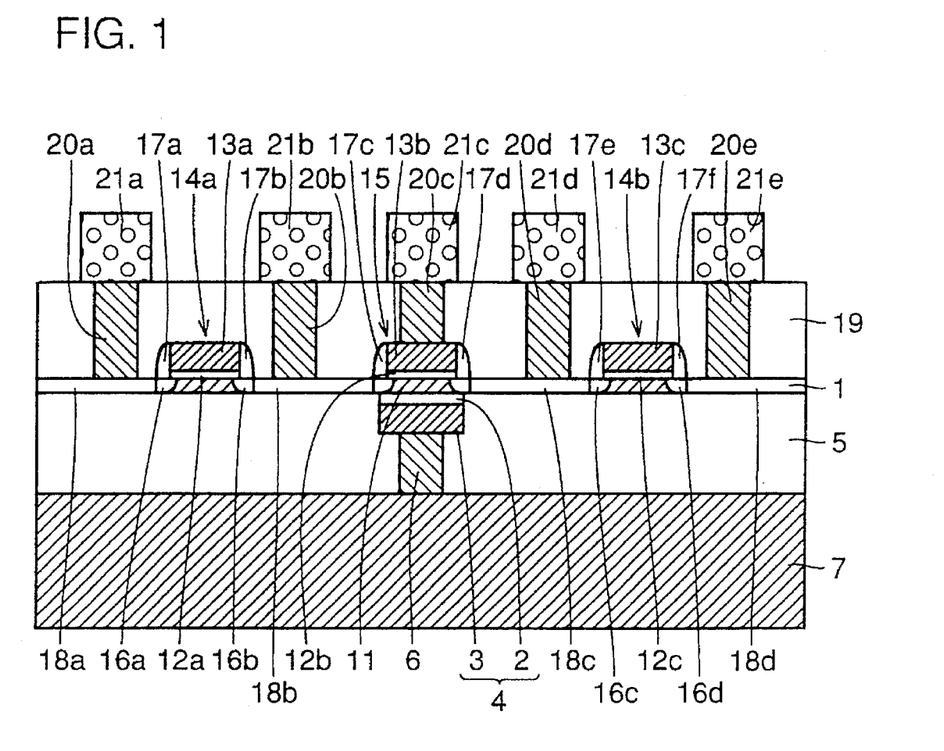
FIG. 1 is a sectional view showing a semiconductor device having an SOI structure employing field shield isolation according to a first embodiment of the present invention.

With reference to FIG. 1, in a semiconductor device according to the first embodiment, a silicon oxide film 5 with a thickness of 5000 to 1000Å is formed on a silicon substrate 7. On silicon oxide film 5, an SOI layer 1 with a thickness of about 1000Å is formed. On SOI layer 1, active transistors 14a and 14b are formed at a predetermined interval from each other.

Active transistor 14a is composed of n-type impurity regions 16a (18a) and 16b (18b) constituting a pair of source and drain regions formed at a predetermined interval from each other in SOI layer 1, and a gate electrode 13a formed on SOI layer 1 between n-type impurity regions 16a and 16b with a gate oxide film 12a interposed therebetween. Sidewall oxide films 17a and 17b are formed in contact with the opposite side surfaces of gate electrode 13a. Active transistor 14b is composed of n-type impurity regions 16c (18c)

and 16d (18d) constituting a pair of source and drain regions formed at a predetermined interval from each other in SOI layer 1, and a gate electrode 13c formed between n-type impurity regions 16c and 16d with a gate oxide film 12c interposed therebetween. Sidewall oxide films 17e and 17f are formed in contact with the opposite side surfaces of gate electrode 13c.

A gate electrode 13b is formed on the isolation region of SOI layer 1 with a gate oxide film 12b interposed therebetween. Sidewall oxide films 17c and 17d are formed in contact with the opposite side surfaces of gate electrode 13b. An interlayer insulating film 19 made of a silicon oxide film with a thickness of approximately 5000Å is formed to cover the whole surface. Contact holes are formed at predetermined regions of interlayer insulating film 19. In these contact holes, plug electrodes 20a, 20b, 20c, 20d and 20e are buried to be electrically connected to n-type impurity regions 18a, 18b, gate electrode 13b in the isolation region, and n-type impurity regions 18c and 18d, respectively. These plug electrodes 20a to 20e are made of tungsten, for example. Aluminum interconnections 21a, 21b, 21c, 21d and 21e are formed to be electrically connected to plug electrodes 20a, 20b, 20c, 20d and 20e, respectively.

In this embodiment, a field shield gate 4 is buried in silicon oxide film 5 located under the isolation region of SOI layer 1. Field shield gate 4 is composed of an oxide film 2 formed underneath SOI layer 1 to be in contact therewith, and a field shield gate electrode 3 formed underneath oxide film 2 to be in contact therewith. Field shield gate electrode 3 and silicon substrate 7 are electrically connected to a conductor layer 6 made of tungsten or polysilicon buried in silicon oxide film 5.

As described in the foregoing, by providing the field shield gate under SOI layer 1, the present embodiment realizes a planar SOI structure than the SOI structure based on conventional field shield isolation shown in FIG. 20. As a result, the present embodiment can produce an effect of improving element planarization in addition to the an effect of preventing generation of a parasitic MOS transistor and substrate floating effects which are inherently involved in field shield isolation.

In addition, by electrically connecting field shield gate electrode 3 and silicon substrate 7 through conductor layer 6, it is possible to readily apply a predetermined voltage to field shield gate electrode 3 even in a structure in which field shield gate 4 is buried. In such a case as the present embodiment where active transistors 14a and 14b are N-channel transistors, 0 V (Vss) or a negative potential is applied to field shield gate electrode 3. When a negative potential is applied, a portion 11 located in the isolation region of SOI layer 1 turns to a p-type storage layer, which further enhances element isolation as a result.

With reference to FIGS. 2 to 16, a semiconductor device manufacturing process according to the first embodiment will be described.

Figure 2:
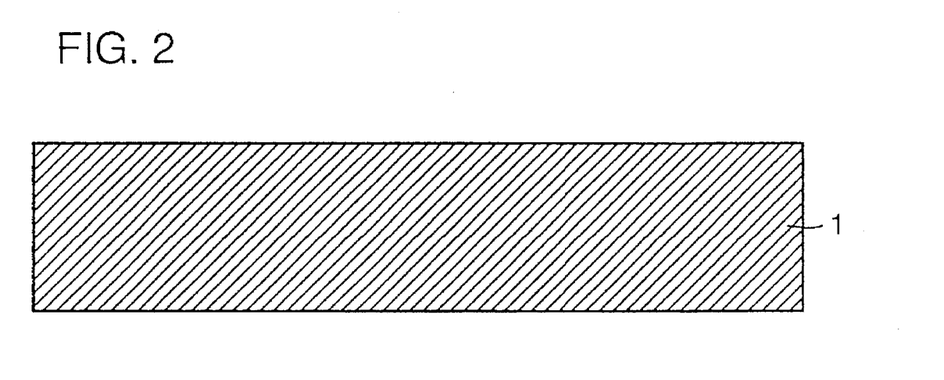
FIG. 2 is a sectional view for use in explaining a first step of a semiconductor device manufacturing process according to the first embodiment shown in FIG. 1.
Figure 3:
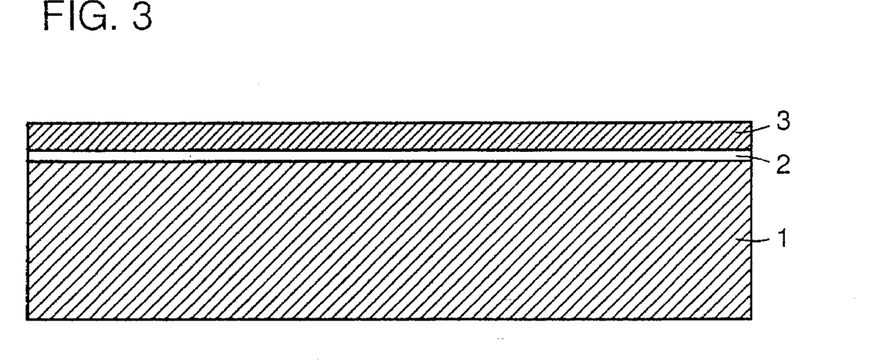
FIG. 3 is a sectional view for use in explaining a second step of the semiconductor device manufacturing process according to the first embodiment shown in FIG. 1.
Figure 4:
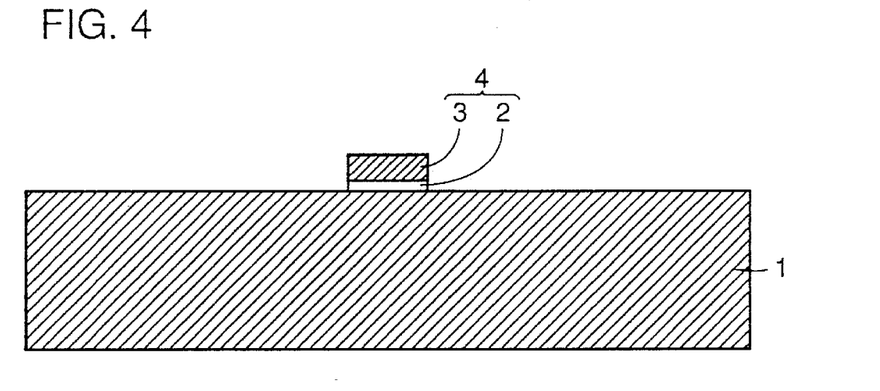
FIG. 4 is a sectional view for use in explaining a third step of the semiconductor device manufacturing process according to the first embodiment shown in FIG. 1.

First, a silicon substrate 1 is prepared as shown in FIG. 2. Then, as shown in FIG. 3, a silicon oxide film 2 and a polysilicon layer 3 are sequentially deposited on silicon substrate 1 by the low pressure CVD (Chemical Vapor Deposition) method or the like. Silicon oxide film 2 and polysilicon layer 3 are formed to have a thickness of about 100Å and 2000Å, respectively. Thereafter, polysilicon layer 3 and oxide film 2 are patterned by ordinary photo-lithography and dry etching. As a result, such a field shield gate 4 as shown in FIG. 4 is formed of oxide film 2 and field shield gate electrode 3 of predetermined shape.

Figure 5:
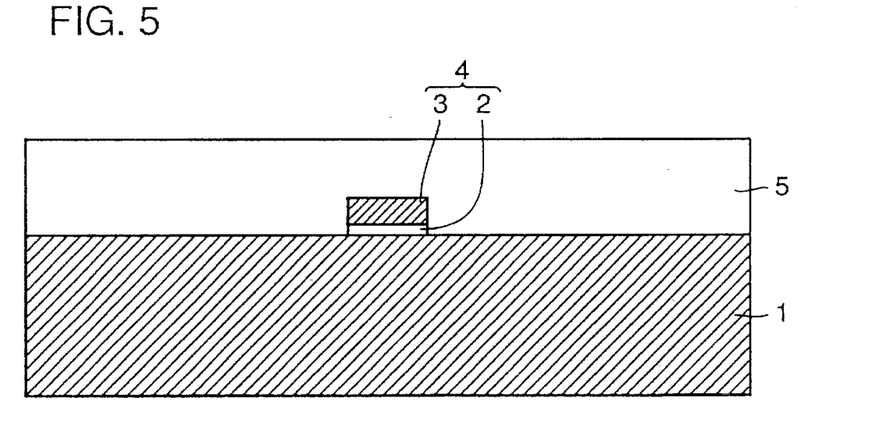
FIG. 5 is a sectional view for use in explaining a fourth step of the semiconductor device manufacturing process according to the first embodiment shown in FIG. 1.

Thereafter, as shown in FIG. 5, an interlayer insulating film 5 made of a silicon oxide film is deposited to a thickness of 5000 to 10000Å to cover the whole surface, which surface is then etched back by dry etching, thereby planarizing the upper surface of interlayer insulating film 5.

Figure 6:
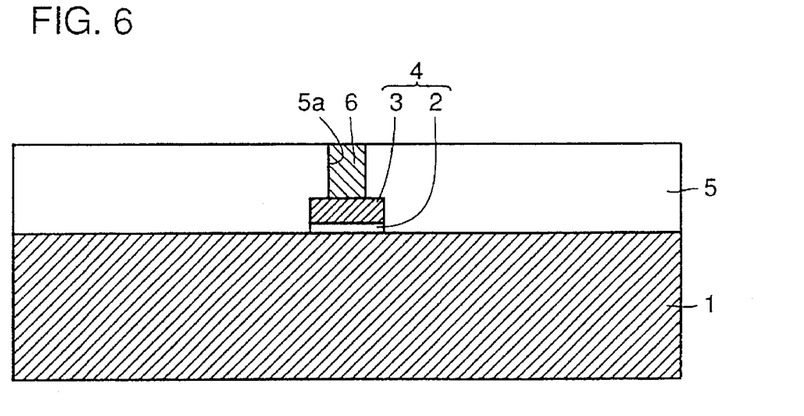
FIG. 6 is a sectional view for use in explaining a fifth step of the semiconductor device manufacturing process according to the first embodiment shown in FIG. 1.
Figure 7:
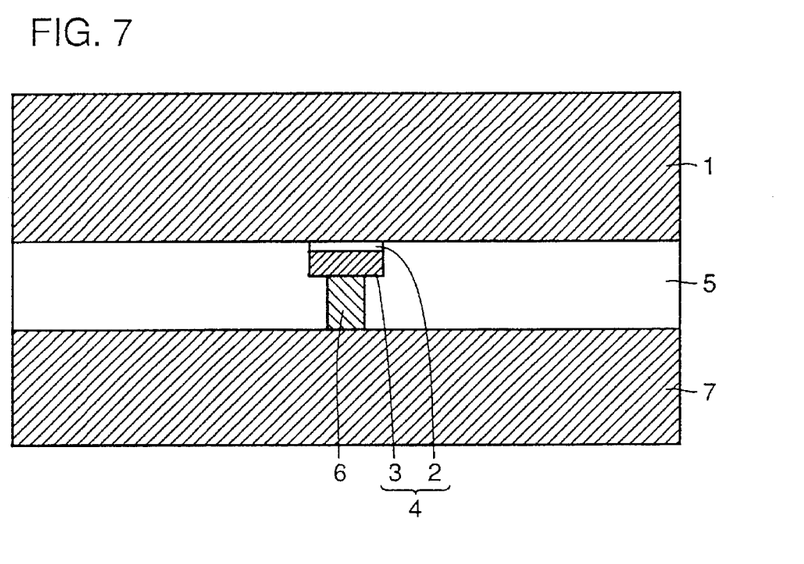
FIG. 7 is a sectional view for use in explaining a sixth step of the semiconductor device manufacturing process according to the first embodiment shown in FIG. 1.
Figure 8:
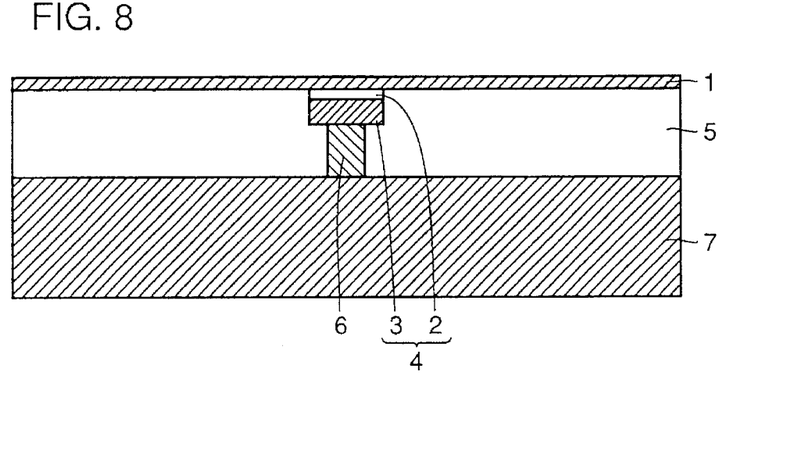
FIG. 8 is a sectional view for use in explaining a seventh step of the semiconductor device manufacturing process according to the first embodiment shown in FIG. 1.

Then, as shown in FIG. 6, a contact hole 5a is formed in a region on field shield gate electrode 3 in interlayer insulating film 5 by ordinary photo-lithography and dry etching. A conductor layer made of tungsten or polysilicon is formed to fill in contact hole 5a and extend over the upper surface of interlayer insulating film 5 by sputtering or the low pressure CVD method. Thereafter, the whole surface is etched back by dry etching to form a conductor layer 6 completely buried in contact hole 5a. Then, after attaching a second silicon substrate 7 to the side of conductor layer 6, the entire part is turned upside down to place silicon substrate 1 on the upper side as shown in FIG. 7. Then, silicon substrate 1 is abraded to form such an SOI layer 1 with a thickness of approximately 1000Å as shown in FIG. 8.

Figure 9:
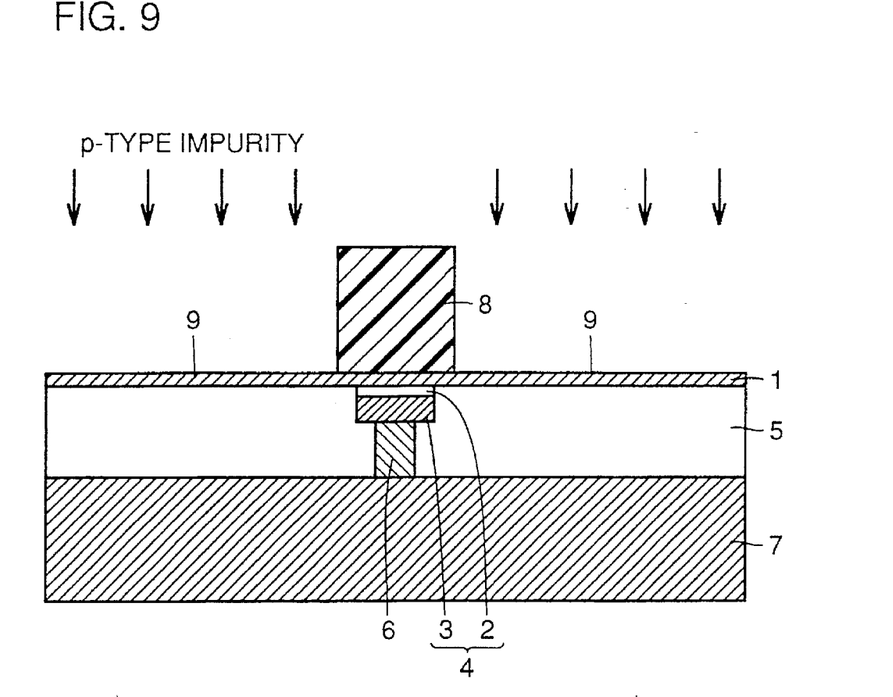
FIG. 9 is a sectional view for use in explaining an eighth step of the semiconductor device manufacturing process according to the first embodiment shown in FIG. 1.

A resist 8 is formed to cover the element isolation region by photo-lithography as shown in FIG. 9. A p-type impurity for adjusting a threshold voltage of a transistor is implanted in SOI layer 1 by using resist 8 as a mask to form a p-type impurity region 9. This implantation is conducted by using, for example, boron ions at an impurity concentration of $1 \times 10^{13}/cm^2$. Thereafter, resist 8 is removed.

Figure 10:
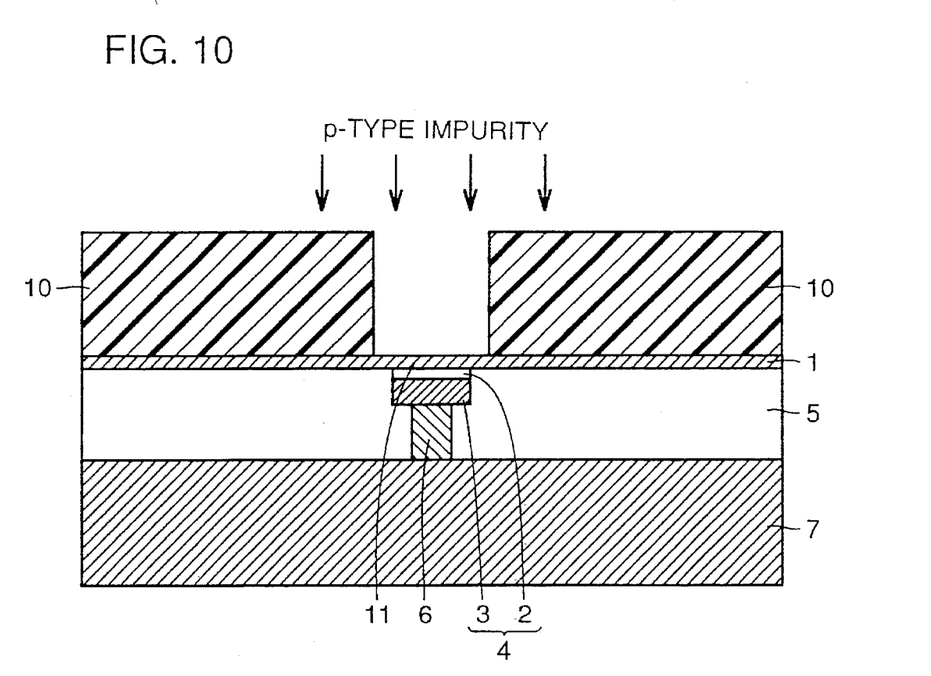
FIG. 10 is a sectional view for use in explaining a ninth step of the semiconductor device manufacturing process according to the first embodiment shown in FIG. 1.

As shown in FIG. 10, a resist 10 is formed to cover other regions than the element isolation region by photo-lithography. With resist 10 as a mask, a p-type impurity for adjusting isolation capability is implanted in SOI layer 1. This implantation is conducted for increasing a threshold voltage of the field shield gate or a breakdown voltage for element isolation. As a result, a p-type impurity region 11 is formed. The implantation is conducted by using, for example, boron at a concentration of $1 \times 10^{13}/cm^2$. Thereafter, resist 10 is removed. It is possible to omit the steps shown in FIGS. 9 and 10 depending on a value set as a threshold voltage of a transistor.

Figure 11:
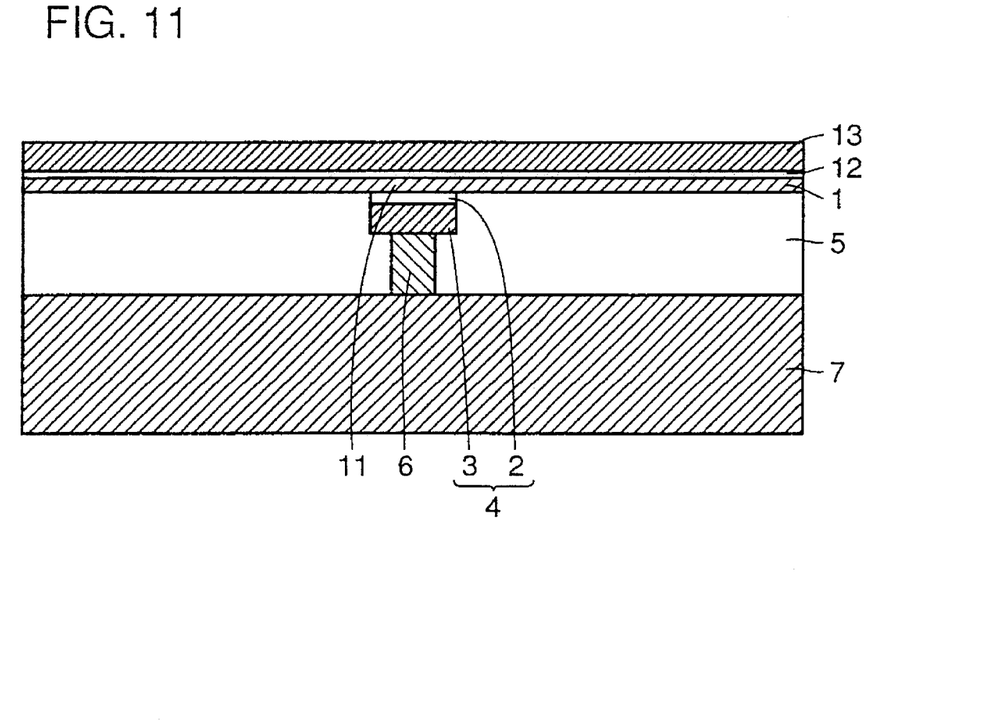
FIG. 11 is a sectional view for use in explaining a tenth step of the semiconductor device manufacturing process according to the first embodiment shown in FIG. 1.
Figure 12:
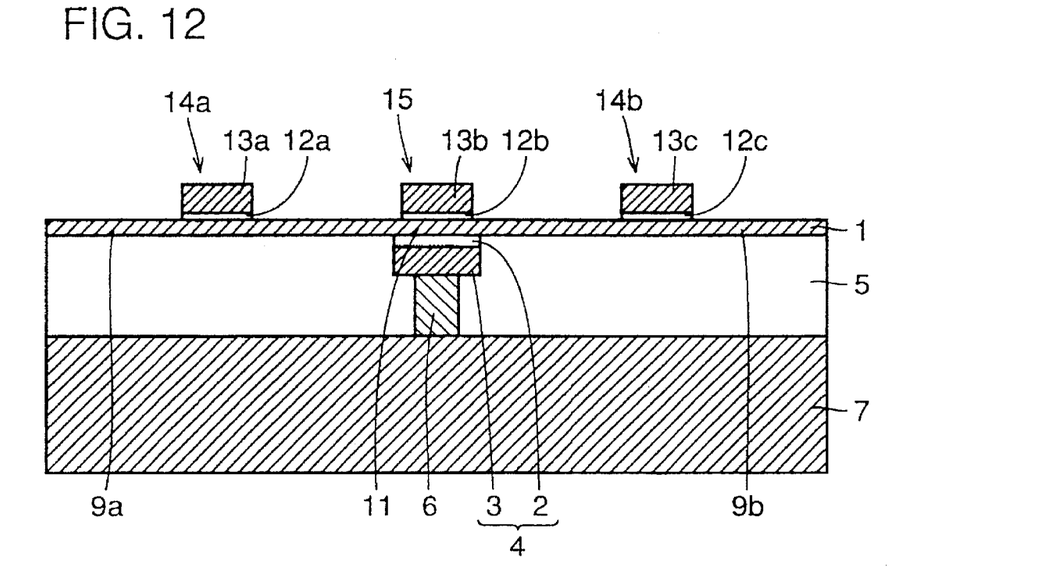
FIG. 12 is a sectional view for use in explaining an 11th step of the semiconductor device manufacturing process according to the first embodiment shown in FIG. 1.
Figure 13:
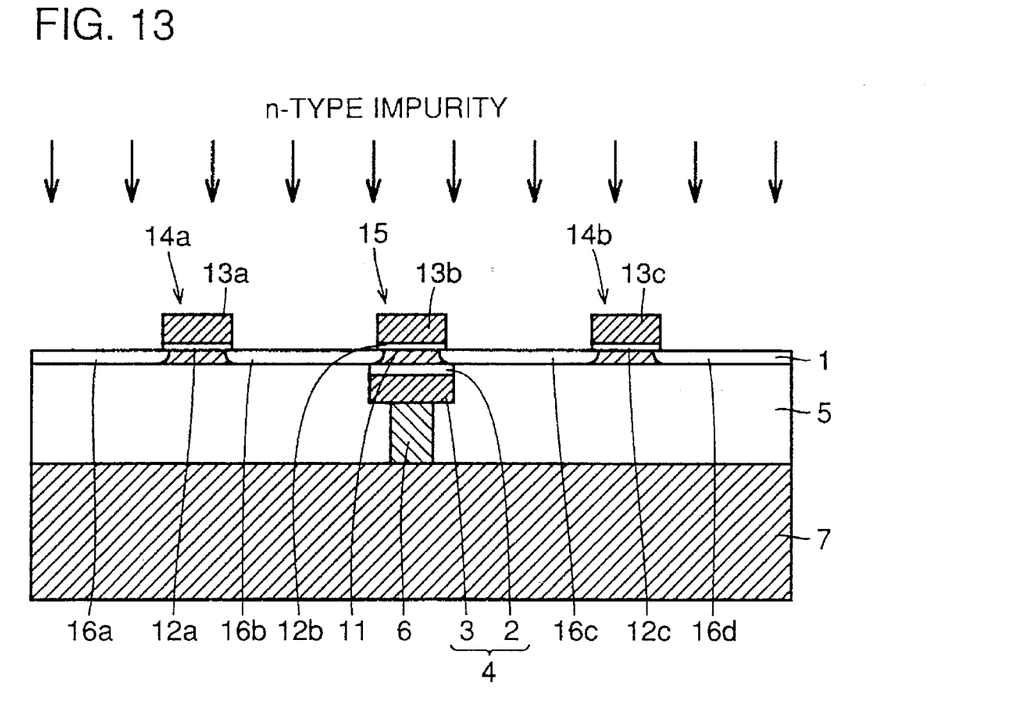
FIG. 13 is a sectional view for use in explaining a 12th step of the semiconductor device manufacturing process according to the first embodiment shown in FIG. 1.

As shown in FIG. 11, a gate oxide film 12 is formed to have a thickness of about 100Å on SOI layer 1 by thermal oxidation or the CVD method. Then, a polysilicon layer 13 to be a gate electrode is formed to have a thickness of about 2000Å on gate oxide film 12 by the CVD method. Thereafter, polysilicon layer 13 and gate oxide film 12 are patterned by ordinary photo-lithography or dry etching to form gate oxide films 12a, 12b and 12c, and gate electrodes 13a, 13b and 13c of such shape as shown in FIG. 12. Then, an n-type impurity is implanted in SOI layer 1 using gate electrodes 13a, 13b and 13c as a mask. This implantation is conducted by using, for example, phosphorus at an impurity concentration of $1 \times 10^{13}/cm^2$. As a result, such n-type impurity regions 16a, 16b, 16c and 16d of low impurity concentration as shown in FIG. 13 are formed.

Figure 14:
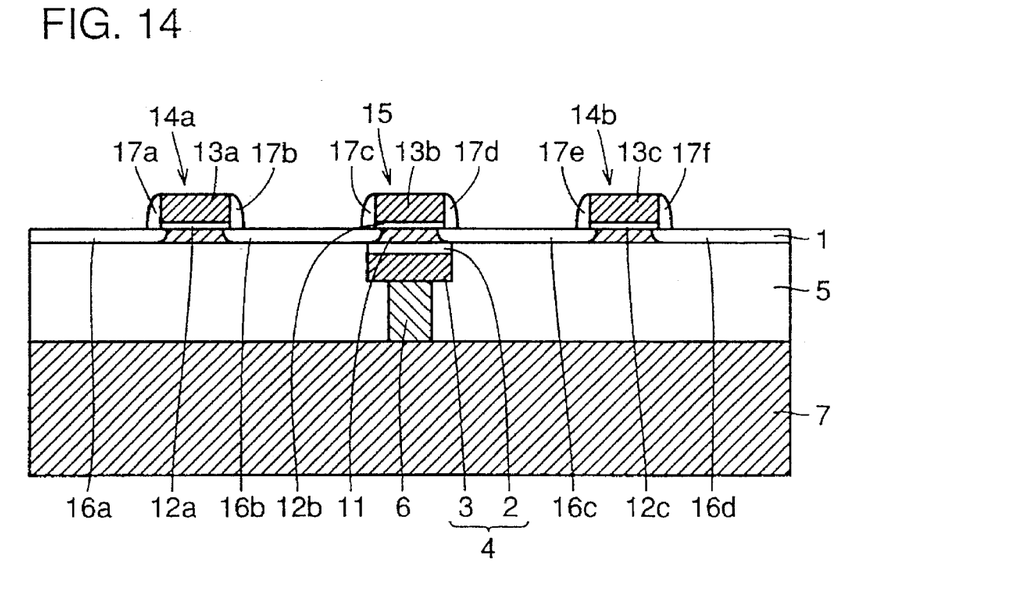
FIG. 14 is a sectional view for use in explaining a 13th step of the semiconductor device manufacturing process according to the first embodiment shown in FIG. 1.

As shown in FIG. 14, a silicon oxide film is formed to a thickness of about 1000Å on the whole surface and then the silicon oxide film is wholly etched back by dry etching to form sidewall oxide films 17a, 17b, 17c, 17d, 17e and 17f.

Figure 15:
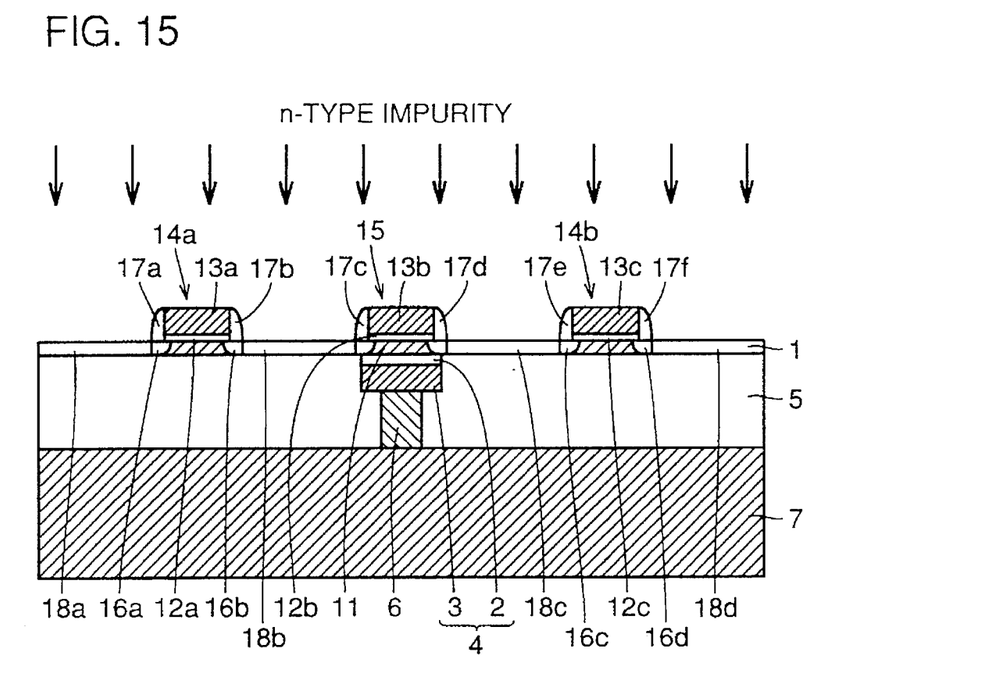
FIG. 15 is a sectional view for use in explaining a 14th step of the semiconductor device manufacturing process according to the first embodiment shown in FIG. 1.

As shown in FIG. 15, ions of an n-type impurity are implanted in SOI layer 1 by using gate electrodes 13a, 13b and 13c and sidewall oxide films 17a, 17b, 17c, 17d, 17e and 17f as a mask. This implantation is conducted by using arsenic at a concentration of $1 \times 10^{15}/cm^2$, whereby high concentration n-type impurity regions 18a, 18b, 18c and 18d are formed. As a result, a combination of n-type impurity regions 16a to 16d of low impurity concentration and n-type impurity regions 18a to 18d of high impurity concentration forms source/drain regions having the LDD (Lightly Doped Drain) structure. Although the source/drain regions are formed to have the LDD structure in this embodiment, they may have other types of structure.

Figure 16:
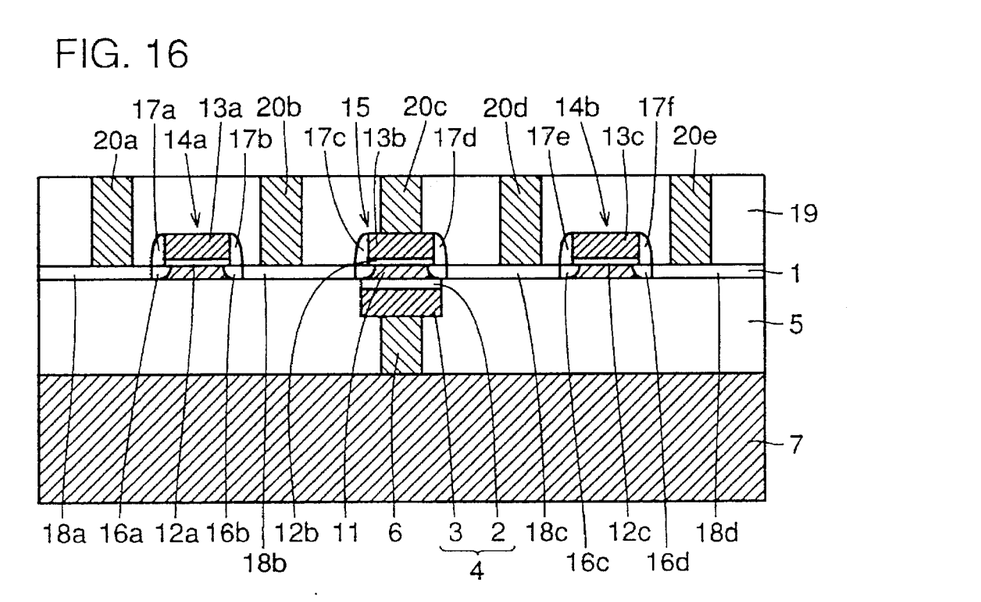
FIG. 16 is a sectional view for use in explaining a 15th step of the semiconductor device manufacturing process according to the first embodiment shown in FIG. 1.

As shown in FIG. 16, an interlayer insulating film 19 made of a silicon oxide film is formed to have a thickness of about 5000Å by the CVD method. Thereafter, contact holes are formed at predetermined regions of interlayer insulating film 19 and then plug electrodes 20a, 20b, 20c, 20d and 20e of e.g. tungsten are formed to fill the contact holes. Lastly, aluminum interconnections 21a, 21b, 21c, 21d and 21e are formed to be electrically connected to plug electrodes 20a, 20b, 20c, 20d and 20e as shown in FIG. 1. Thus, the semiconductor device of the first embodiment is completed. Although field shield gate electrode 3 and gate electrodes 12a and 12c of active transistors 14a and 14b are made of polysilicon in the above-described first embodiment, they may be formed as a composite film of polysilicon and tungsten silicide (WSi).

Figure 17:
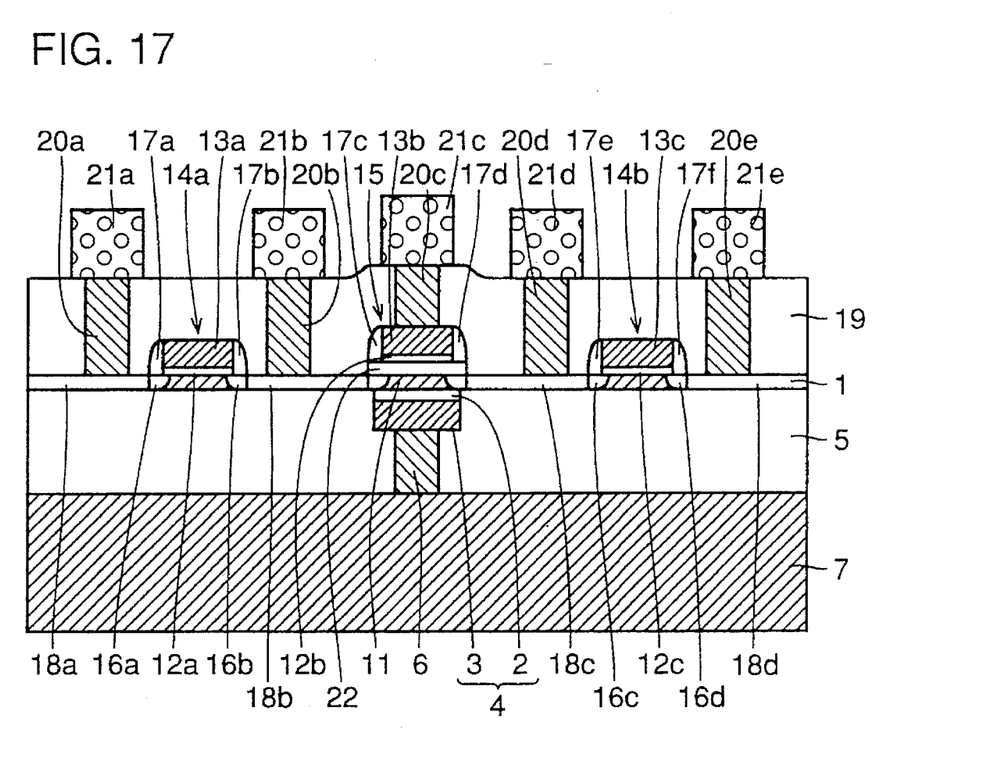
FIG. 17 is a sectional view showing a semiconductor device having an SOI structure employing field shield isolation according to a second embodiment of the present invention.

With reference to FIG. 17, in the semiconductor device of the second embodiment, unlike the above-described first embodiment, a silicon oxide film 22 having a thickness of about 500Å is interposed between SOI layer 1 and gate oxide film 12b located in the element isolation region. Such an arrangement enables effects to be minimized which are produced by the electric fields of gate electrode 13b when a voltage is applied thereto, thereby further improving the element isolation capability.

The semiconductor device according to one aspect of the present invention, by providing a field shield gate electrode under an element isolation region of a semiconductor layer with a second insulating layer interposed therebetween, can have advantages of achieving a planar element isolation structure as well as preventing generation of a parasitic transistor and substrate floating effects inherent in field shield isolation. In addition, forming a conductor layer under a first insulating layer and electrically connecting the field shield gate electrode and the conductor layer through a plug electrode provided in the first insulating layer enables application of a predetermined potential to the field shield gate electrode with ease through application of the same to the conductor layer even when the field shield gate electrode is buried. Furthermore, forming a third insulating layer in the element isolation region on the semiconductor layer and forming a gate electrode on the third insulating layer with a gate insulating film interposed therebetween enables the third insulating layer to reduce effects of electric fields produced by the gate electrode, whereby an element isolation capability can be improved.

In the semiconductor device manufacturing method according to another aspect of the present invention, a field shield gate electrode is formed in an element isolation region on a main surface of a first semiconductor substrate, a second insulating film is then formed to cover the field shield gate electrode, a second semiconductor substrate is formed on an upper surface of the second insulating film to be contact therewith and a rear surface of the second semiconductor substrate is cut by a predetermined thickness to form a semiconductor layer, whereby a buried field shield gate electrode is completed with ease. As a result, it is possible to readily obtain an SOI structure employing field shield isolation, in which the element isolation region is planarized.

Although the preferred embodiments have been described in detail in the foregoing, it will be apparent to those skilled in the art that many modifications and variations may be made without departing from the spirit of the invention, and these are therefore considered to be within the scope of the invention as defined by the following claims.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a semiconductor substrate having a first insulating layer thereon;
    a semiconductor on insulator (SOI) layer formed on the insulating layer;
    a transistor formed in an active region of said semiconductor SOI layer; and
    a field shield gate electrode formed only in an element isolation region under said semiconductor SOI layer with a second insulating layer interposed therebetween.

2. The semiconductor device according to claim 1, wherein
    a conductive layer is formed under said first insulating layer; and
    said field shield gate electrode and said conductive layer are electrically connected to each other with a plug electrode provided in said first insulating layer.

3. The semiconductor device according to claim 1, wherein
    a third insulating layer is formed in the element isolation region of said semiconductor layer; and
    a gate electrode is formed on said third insulating layer with a gate insulating film interposed therebetween.

4. The semiconductor device according to claim 3, wherein said third insulating layer has a thickness of approximately 500Å.

5. The semiconductor device according to claim 1, wherein said transistor includes:
    a first field effect transistor; and
    a second field effect transistor formed to sandwich said element isolation region with said first field effect transistor.

6. The semiconductor device according to claim 1, wherein
    a third interlayer insulating film is formed to have its upper surface planarized so as to cover said semiconductor layer and said transistor;
    a contact hole is formed at source/drain regions of said transistor in said interlayer insulating film;
    a plug electrode is buried in said contact hole; and
    an aluminum interconnection is formed in contact with the upper surface of said plug electrode.

7. The semiconductor device according to claim 1, wherein a gate electrode is formed on said semiconductor layer where said field shield gate electrode is located, with a gate insulating film interposed therebetween.

8. The semiconductor device according to claim 1, wherein
    said transistor is an n-type field effect transistor; and
    zero or negative voltage is applied to said field shield gate electrode.

9. The semiconductor device according to claim 1, wherein said second insulating layer and said field shield gate electrode are buried in said first insulating layer.

10. A semiconductor device manufacturing method comprising the steps of:

forming a semiconductor layer on a first insulating layer;

forming a transistor in an active region of said semiconductor layer; and forming a second insulating layer and a field shield gate electrode to be buried in said first insulating layer located under an element isolation region of said semiconductor layer.

11. A semiconductor device manufacturing method comprising the steps of:

forming a field shield gate electrode in an element isolation region on the main surface of a first semiconductor substrate with a first insulating film interposed therebetween;

forming a second insulating film to cover said field shield gate electrode and then forming a contact hole above said field shield gate electrode;

forming a conductive layer to be buried in said contact hole;

forming a second semiconductor substrate to be in contact with the upper surface of said second insulating film and the upper surface of said conductive layer; and forming a semiconductor layer by cutting the rear surface of said first semiconductor substrate by a predetermined thickness.

* * * * *